(12) United States Patent
Yaghmai et al.

(10) Patent No.: US 8,822,898 B2
(45) Date of Patent: Sep. 2, 2014

(54) IMAGER ROW CONTROL-SIGNAL TESTER

(75) Inventors: Sohrab Yaghmai, Oslo (NO); Tore Martinussen, Strømmen (NO)

(73) Assignee: Aptina Imaging Corporation, George Town (KY)

( * ) Notice: Subject to any disclaimer, the term of this patent is extended or adjusted under 35 U.S.C. 154(b) by 287 days.

(21) Appl. No.: 13/246,902

(22) Filed: Sep. 28, 2011

(65) Prior Publication Data

US 2013/0075584 A1 Mar. 28, 2013

(51) Int. Cl.
*H01L 27/146* (2006.01)

(52) U.S. Cl.
USPC ........................................ 250/208.1

(58) Field of Classification Search
USPC .............................. 250/208.1, 214 VT, 214 R
See application file for complete search history.

(56) References Cited

U.S. PATENT DOCUMENTS

| | | | |
|---|---|---|---|
| 8,169,498 B2 * | 5/2012 | Yamashita | 348/222.1 |
| 2009/0051414 A1 | 2/2009 | Pahr | |
| 2009/0256940 A1 | 10/2009 | Pahr | |

* cited by examiner

*Primary Examiner* — Tony Ko
(74) *Attorney, Agent, or Firm* — Kendall P. Woodruff (57) ABSTRACT

Row-control signal monitoring system for an electronic imager includes signal processing circuitry coupled a pixel array of the electronic imager which receives at least one row control signal from the pixel array and provides an output signal corresponding to the selected row control signal. Monitoring circuitry compares the output signal to a target value to test the at least one row-control signal.

18 Claims, 5 Drawing Sheets

IMAGER ROW CONTROL-SIGNAL TESTER

FIELD OF THE INVENTION

The invention relates to testers for semiconductor imagers and in particular to an on-chip device that tests the row control signals of a semiconductor imager.

BACKGROUND

Semiconductor imagers have dropped in cost in recent years and are now found not just in cameras but in many different devices such as computers, mobile telephones, automobiles and video games. As these imagers are currently used for monitoring critical devices such as automobiles, it is important that they operate properly and that any operational failure be identified quickly so that corrective measures may be taken.

DETAILED DESCRIPTION

Figure 1:
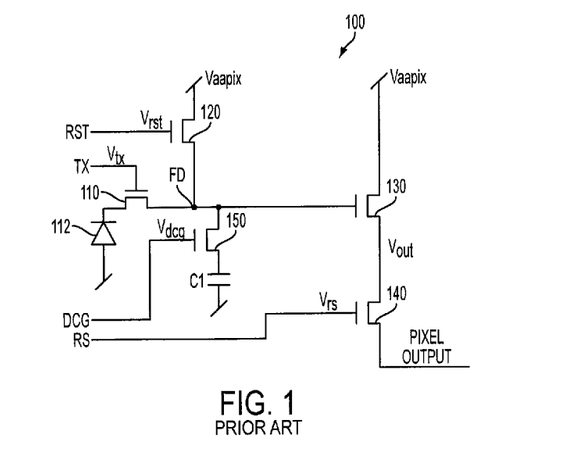
FIG. 1 is a schematic diagram of an example semiconductor pixel.

FIG. 1 is a schematic diagram of a conventional five-transistor (5T) CMOS image sensor pixel 100 with dual conversion gain which is useful for describing the row control signals of a semiconductor imager. Pixel 100 includes a number of row control signals, described below. These include Reset control signal (RST), Transfer control signal (TX), Row Select control signal (RS) and Dual Conversion Gain control signal (DCG). In a conventional imager, these signals are shared by every pixel in a row of pixels.

The transistors in pixel 100 include a transfer transistor 110, a reset transistor 120, a source follower transistor 130, a row select transistor 140 and a dual conversion gain transistor 150. The transfer transistor 110, responsive to a transfer control signal TX, transfers charge collected by a photodiode 112 to a floating diffusion region FD. The reset transistor 120, responsive to a reset control signal RST, resets the floating diffusion region FD to the supply voltage Vaapix. The source follower transistor 130 has its gate connected to the floating diffusion region FD and is connected between the supply voltage Vaapix and the row select transistor 140.

The source follower transistor 130 converts the potential at the floating diffusion region FD (associated with the transferred charge or reset voltage) into an electrical output voltage signal Vout. The row select transistor 140 is responsive to a row select signal RS to selectively connect the source follower transistor 130 and the output voltage signal Vout to a column line of a pixel array. The dual conversion gain transistor 150 has its source terminal connected to the floating diffusion region FD and its drain connected to a first side of an in-pixel capacitor C1. The second side of the capacitor C1 is connected to a ground potential. The gate of the dual conversion gain transistor 150 is responsive to a dual conversion gain control signal DCG.

The capacitance of the capacitor C1 is coupled to the floating diffusion region FD when the dual conversion gain control signal DCG is applied to turn on the dual conversion gain transistor 150. Once the capacitor C1 is coupled to the floating diffusion region FD, the conversion gain of the emitter follower transistor 130 will decrease. Thus, the pixel 100 has a second conversion gain when the dual conversion gain signal DCG turns on the dual conversion gain transistor 150. As illustrated in FIG. 1, NMOS transistor gate control voltages are at least one threshold voltage Vt higher than a supply voltage Vaapix to ensure that the transistors are turned on.

In the pixel 100, the maximum drain or source voltage for the transfer transistor 110, reset transistor 120, row select transistor 140 and the dual conversion gain transistor 150 is equal to the pixel supply voltage Vaapix. Therefore, the control signal activating voltages Vtx, Vrst, Vrs and Vdcg are desirably at least equal to the pixel supply voltage Vaapix plus a threshold voltage Vt.

Unfortunately, the threshold voltage Vt of an NMOS transistor is dependent on the individual characteristics of a transistor as well as the drain or source voltage. Thus, in the case of the transistors in pixel 100, the threshold voltage Vt for a specific transistor is dependent upon physical characteristics of the transistor and the maximum voltage supplied to the terminals of the transistor. In FIG. 1, the maximum voltage supplied to the terminals of any of the transistors in FIG. 1 is, generally, the supply voltage Vaapix. Typically, the supply voltage Vaapix in pixel 100 is rated to have a ±10% tolerance. If, for example, the supply voltage Vaapix is rated to be 3.3V ±10%, it is possible that the maximum voltage applied to a transistor source or drain is 3.6V. This means that the control voltages Vtx, Vrst, Vrs and Vdcg should each be at least 3.6V plus the threshold voltage Vt that corresponds to a source or drain voltage of 3.6V (which is, incidentally, higher than the threshold voltage Vt that corresponds to a source or drain voltage of 3.3V). The threshold voltage for each transistor in the pixel 100 may also vary with the structure and location of the transistor. Thus, the threshold voltage for each transistor in the 5T pixel may be different.

Because the required control voltages may be different, one method of providing control voltages is to assume a constant threshold voltage Vt of sufficient value in order to guarantee a sufficient gate control voltage. For example, a control voltage for the transistors in pixel 100 could be made equal to the supply voltage Vaapix plus a threshold voltage Vt that is large enough to always correspond to the maximum source or drain voltage (e.g., 3.08V in the case of a rated supply voltage Vaapix of 2.8V ±10%). Though this approach may be adequate for some pixel designs utilizing a lower supply voltage of 2.8V or less, it can be problematic for the pixel 100 when the supply voltage Vaapix is higher than 2.8V (e.g., 3.3V), as higher supply voltages result in applied control voltages approaching the maximum rated operational range of the transistors. Repeatedly applying unnecessarily high control voltages to the gates of NMOS transistors may cause hot carrier degradation of the transistors, reducing the lifetime of an image sensor. In other words, it is preferable to set control voltages no higher than necessary. Although the problem has been explained using, as an example, a 5T pixel having an adjustable conversion gain, it should be evident that the problem exists in other pixel circuit designs employing NMOS transistors, as well as in other circuits using NMOS transistors.

A circuit that generates a boost signal for the row control-signals is described in published U.S. application no. 2009/0256940 to Pahr entitled, Method and Apparatus Providing Dynamic Boosted Control Signal for a Pixel.

Figure 2:
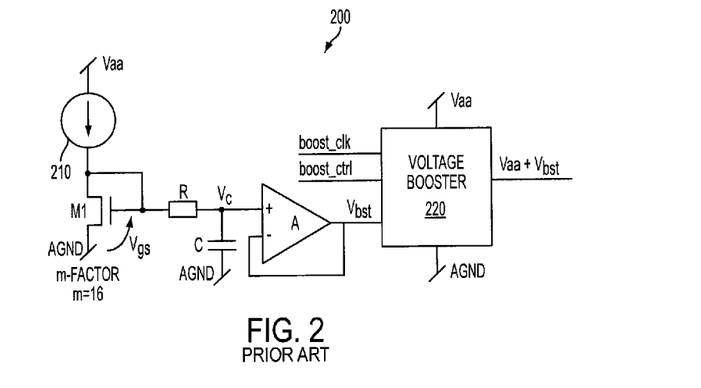
FIG. 2 is a schematic diagram, partly in block diagram form of an example control signal boost circuit.

FIG. 2 is a schematic diagram of a circuit disclosed in the above-referenced patent application. In the circuit 200, transistor M1 is selected to have a width W and a length L equal to that of the pixel transistor that is to receive the control voltage Vaa+Vbst (e.g., transistors 110, 120, 140 or 150 of FIG. 1). The transistor M1 is diode-connected, meaning that the gate and the drain of transistor M1 are shorted together. The source of transistor M1 is connected to a ground potential AGND, while the drain of transistor M1 is connected to a DC bias current source 210.

The DC bias current source 210 draws power from a supply voltage Vaa, which is desired to be equal to the supply voltage Vaapix of pixel 100 (e.g., Vaa=2.8V). The DC bias current is generally supplied to more than one transistor M1 so as to obtain an averaged gate-to-source voltage for the transistor M1. In the example illustrated in FIG. 2, the DC bias current is provided to 16 transistors M1 (m-factor m=16). The measured gate-to-source voltage Vgs from the m transistors M1 is combined and averaged and then filtered through an RC circuit that includes resistor R and capacitor C serially connected between the gate of transistor M1 and the ground potential AGND. The resulting voltage Vc across capacitor C is equal to Vgs/(1+jωRC) where ω is the radian frequency. Hence, at direct current, ω=0 and Vc=Vgs. The voltage Vc is passed through a unity gain buffer amplifier A which has a high input impedance (and thus does not affect the gate-to-source voltage) and a low output impedance, thus creating a near-perfect voltage source (booster voltage Vbst) for a voltage booster 220.

The voltage booster 220, with clock inputs boost_clk, boost_ctrl, generates a control voltage Vaa+Vbst by boosting the source voltage Vaa with the booster voltage Vbst. One method of implementing the voltage booster 220 is disclosed in published U.S. application 2009/0051414 to Pahr entitled, Dual Conversion Rate Voltage Booster Apparatus and Method. Briefly, this circuit includes a level shifter, similar to that shown in FIG. 8B which stores the voltage Vbst during a first time interval and then couples the capacitor to the voltage Vaa during a second time interval so that the output boosted voltage is Vaa+Vbst.

The example imager may include multiple boosting circuits 200, one for each of the row control signals, RST, TX, RS and DCG. Each of these circuits is tailored to the transistor being controlled by the corresponding row control signal to avoid applying unnecessarily high control signals to the respective transistors in the pixels in the row of the imager.

The example circuits described below test the row addressing circuitry, the presence of each of the row control-signals and the levels of each of the row-control signals. These example circuits are integrated on the imager chip and test the row control signals when the imager is in use. The errors detected by these circuits may occur because one or more transistors in the row driver, row decoder or in the digital circuitry (not shown) that generates the row value may not have been properly processed during manufacturing. In many cases these transistors will work well enough that the imager will pass probe testing during production but will not operate properly, for example, if driven by high frequency signals when the imager is at a low temperature.

In addition, these transistors may fail due to burn-in effects. For example, the threshold voltage, switching time or leakage exhibited by the transistors may change after the device has been in operation for some time. Again, this type of error is not typically detected during probe testing. These transistors may also exhibit catastrophic failure such as a breakdown of the gate oxide. Finally, a weakness in the metal routing or vias may not be discovered during production. Metal routing breakdown during operation may be caused, for example, by electron migration.

Figure 3:
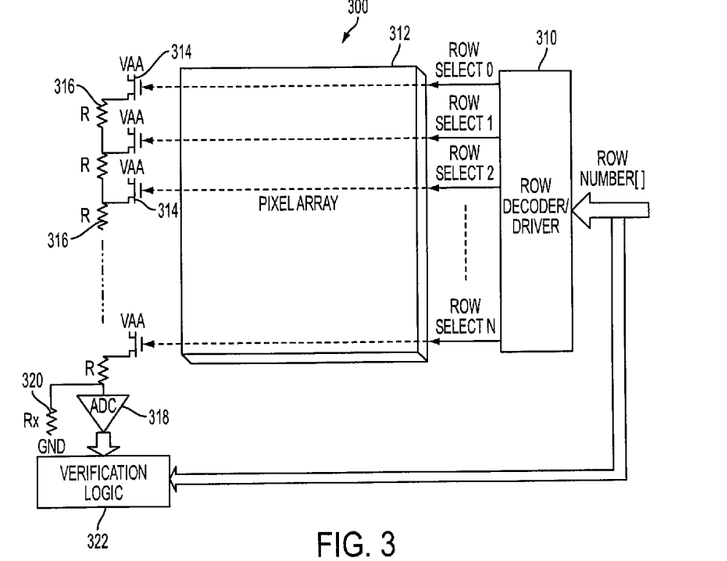
FIGS. 3, 5, 6 and 7 are schematic diagrams, partly in block diagram form of example row-address testers.

FIG. 3 is a schematic diagram of an example circuit which tests the row addressing circuitry. As shown in FIG. 3, an imager 300 includes a row decoder/driver 310 that receives a digital row number value and generates control signals for the specified row in the pixel array 312. An example imager 300 may include separate decoder/driver circuits 310 for each of the row control signals or may include a single decoder/driver circuit 310 that is shared by all of the control signals. In this latter embodiment, the circuit 310 may include latches to latch the value of each control signal while the row address for the next control signal is generated.

The example tester includes a voltage divider network including resistors 316 and 320 on the opposite side of the pixel array 312 from the row driver/decoder 310. The tested row signals are coupled to the gate electrodes of respective transistors 314. Each transistor 314 is configured such that it's source electrode is coupled to Vaa and its drain electrode is coupled to a respective one of the resistors 316. When a row in the pixel array 312 is selected, the transistor 314 corresponding to that row is turned on by the row control signal and the voltage Vaa is applied to the respective resistor 316 of the voltage divider. Vaa is applied to only one resistor at a time in the voltage divider network. The last resistor in the voltage divider is the resistor 320, coupled to the input terminal of analog-to-digital converter (ADC) 318 and to ground. The voltage appearing across resistor 320 varies as a function of the selected row.

This voltage is digitized by the ADC 318 to provide a digital output signal to verification logic 322. Verification logic may, for example, compare the digitized output value to known digital output values corresponding to each row and provide an output signal indicating the row number that is selected. This row number may be compared to the row number applied to the row decoder/driver circuit 310 to determine if the circuit 310 is operating correctly. Because, as described above, the different control signals may have different values, the verification logic 322 may also receive a signal indicating which control signal is being tested in order to properly convert the value provided by the ADC 318 into a row number.

In order to conserve space on the imager, the ADC 318 may be a relatively slow serial device (e.g. a successive approximation ADC) as the row select time may be relatively long. Alternatively, a conventional sample and hold circuit (not shown) may be added to the input terminal of the ADC 318 to hold the signal provided by the voltage divider circuit while the ADC determines the row address value. A 3 Mpixel imager has 1500 rows. Thus, to detect the row address the circuit shown in FIG. 3 uses an 11-bit ADC.

As an alternative to detecting 1500 different levels in a 3 Mpixel imager, groups of the rows may be tied together and an ADC having a smaller number of bits may be used to detect the row address. For example, if the 1500 rows were divided into 15 groups with 100 rows in each group, the respective rows in each group may be tied together and coupled to one resistor of a 100 resistor voltage divider circuit. The detected row address would be the actual row address modulo 100. The row number may be regenerated by adding the group number times 100 to the row value determined by the verification logic. This alternative circuit may employ a 7-bit ADC.

Figure 4:
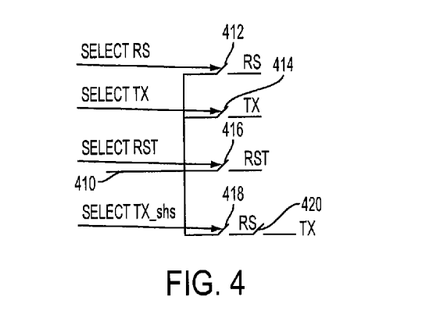
FIG. 4 is a schematic diagram of an example multiplexer circuit suitable for use with the row-address tester shown in FIG. 3.

FIG. 4 is a schematic diagram of an analog multiplexer that may be used on the left side of the pixel array 312 shown in FIG. 3, between the pixel array 312 and the transistors 314. The four input lines are three row control lines, RS, TX and RST. In addition, a fourth line, is connected to the combination of RS and TX which corresponds to the transfer sample-hold-sample (SHS) signal. One of these signals is selected in response to the corresponding selection signal. The output signal 410 of the multiplexer is applied to the respective resistor 316 of the voltage divider. In this way, any one of these signals may be monitored by the circuit shown in FIG. 3. The switches 412, 414, 416, 418 and 420 shown in FIG. 4 may be transmission gates.

Figure 5:
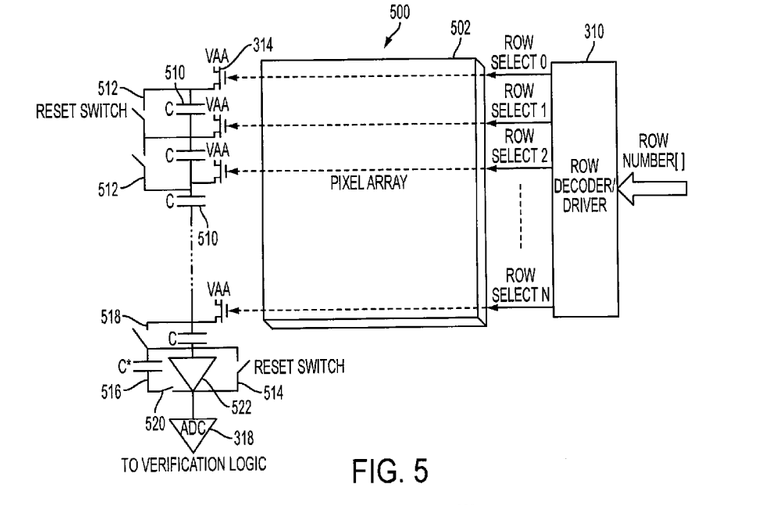

FIG. 5 is a block diagram of an alternate row control signal detection circuit in which the resistors 316 in the voltage divider have been replaced by capacitors 510 and switches 512. In addition, the circuit includes a capacitor 516 and switch 514 that correspond to the resistor 320 in FIG. 3. The circuit also includes a buffer amplifier 522 and a switch 520. In operation, the selected row applies a voltage to one of the capacitors 510 which provides a charge to the input terminal of the buffer amplifier 514. When the switch 520 is closed, the buffer amplifier converts the charge into a voltage that is applied to the input terminal of the ADC 318. The digital values produced by the ADC 318 are applied to verification logic, as described above, to verify that the row number on which the signal(s) occur is the same as that applied to the row decoder/driver 310.

The circuits shown in FIGS. 3 and 5 use resistors or capacitors that are substantially equal in size. These components may be readily manufactured using standard semiconductor processes.

Figure 6:
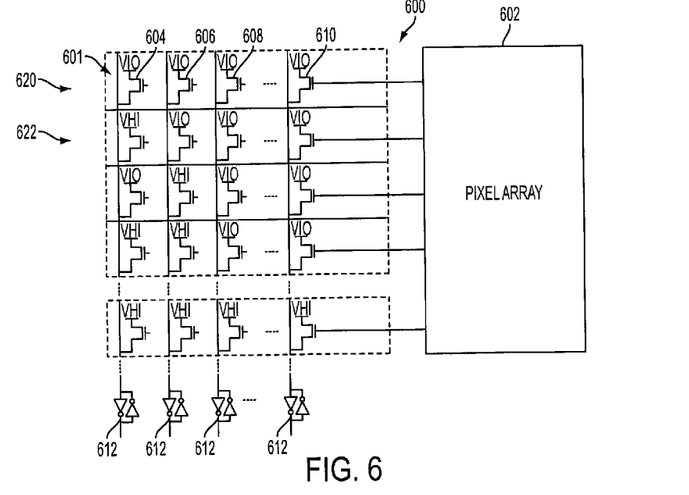

FIG. 6 is a block diagram, partly in schematic diagram form of an alternate example row control signal tester. This circuit 600 includes a pixel array 602 that receives a control signal from a row decoder/driver circuit (now shown) in the same way as described above with reference to FIGS. 3 and 5. Each of the row signals is applied to an n-bit encoder in a encoder array 601. The row signal is applied to the gate electrodes of n transistors. The source electrode of each transistor is coupled either to a logic-high voltage, VHI, or to a logic-low voltage, VLO. The drain electrodes of the transistors in a column of the array are coupled to each other and to respective regenerative latches 612.

The pattern of logic-high and logic-low voltages applied to a row of transistors in the encoder 610 correspond to the address of the pixel row. Thus, the source electrodes of the transistors in row 620 are all coupled to the logic-low voltage, VLO, because the address of this row is 0. The source electrode of the first transistor in row 622 is coupled to VHI and all of the other source electrodes are coupled to VLO because the address of this row is 1. This continues throughout the rows of the encoder array 601 with the transistors in each row being coupled to the voltage sources VHI and VLO so as to provide its binary address to the latches 612.

The number of transistors in each row is selected such that the address of each row may be represented as a binary number. For a 3 Mpixel array, for example, there may be 11 transistors such that each of the 1500 row addresses may be uniquely represented. As described above, this number may be reduced by grouping the rows.

The value held in the latches 612 may be compared to the row number applied to the row decoder/driver (not shown in FIG. 6) to determine if the proper row has been selected.

Figure 7:
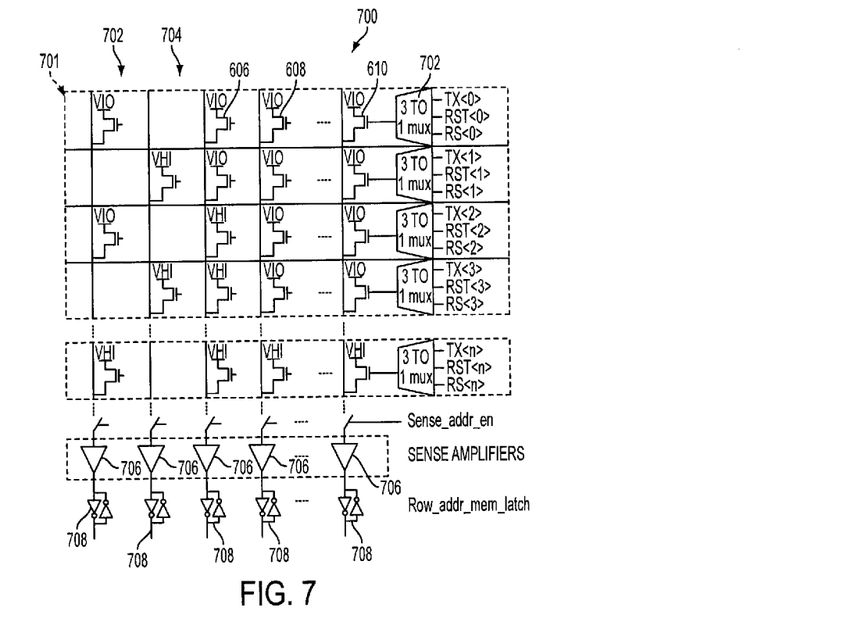

FIG. 7 shows another alternative circuit 700 for testing the row addresses of an imager. This circuit is similar to the circuit shown in FIG. 6 except for the addition of multiplexers 702 and sense amplifiers 706 and a different configuration of the transistors on the far left of the encoder array 701. The multiplexers 702 may be the same as the circuit described above with reference to FIG. 4 and the sense amplifiers 706 may be standard sense amplifiers, such as are commonly used in semiconductor memory circuits.

The multiplexers 702 are used, as described above, to route different ones of the control signals for the pixel array 702 to the encoder array 701. The sense amplifiers are used to detect the signals provided by the individual transistors. It may be desirable to use the sense amplifiers because the routing from an individual row of the encoder array 710 to the regenerative latches 708 may be long and thus exhibit a significant capacitive load. The sense amplifiers 706 amplify the signals provided by the encoders to enable the latches 708 to better differentiate between logic-high and logic-low signals.

The transistor configuration on the left side of the encoder array 701 allows the encoder to operate properly when the pixel array is configured in a binning mode. In this mode, adjacent rows may be combined into a single row and the charge collected by the corresponding pixels in the two rows may be combined to produce a lower-resolution image. In this mode, two rows are selected at the same time. To detect the row address properly, the encoder circuit in FIG. 7 alternates transistors on alternate rows of the left-most two columns, 702 and 704 of the array. These columns correspond to the least significant bit (LSB) positions of the row address value. Thus, in binning mode, when two rows are selected at the same time, all of the other transistors in the two rows provide identical bit values to the sense amplifiers 706 and the last two transistors, which have different values, provide these different values to separate ones of the sense amplifiers 706. In this way, the address of the selected rows may be read properly.

When the imager is not operated in binning mode, a multiplexer (not shown) may couple the two rows to a single latch 708. Because these bits are different, they will alternate as successive rows are selected, thus providing the proper address value to the latches 708.

Figure 8A:
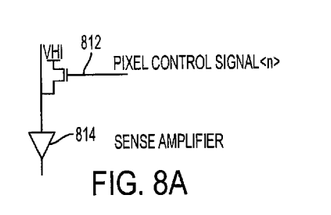
FIGS. 8A and 8B are schematic diagrams of circuitry suitable for use with the example row-address testers shown in FIGS. 6 and 7.

FIG. 8A shows how the pixel control signal is coupled to the sense amplifier 814 through the transistor 812.

Figure 8B:
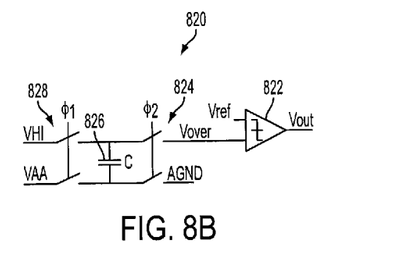

As described above, the row control signals may be boosted. Thus, the detection circuitry may be designed according to high-voltage rules. In addition, it may be desirable to detect whether the control signals are boosted to determine if the boost circuitry is operating properly. FIG. 8B shows a charge pump circuit 820 that may be coupled to a row control line to determine if the imager is operating with the proper boost voltage. Because, as described above the boost voltage, Vbst, may be different for the different control signals and because it is generated by a small set of circuits and then applied to all of the rows in the array, the test circuit may use a single boost voltage detector circuit or a small number of such circuits.

In operation, during a first time interval, switch 828 is closed and a logic-high row control signal is applied to the top plate of a capacitor 826 while Vaa is applied to the lower plate of the capacitor. During a second time interval, switch 828 is opened and switch 824 is closed. This couples the bottom plate of the capacitor to ground and the upper plate to one input terminal of a comparator 822. The other input to the comparator is a reference voltage, Vref. The voltage on the capacitor 826 is Vbst, the difference between the boosted control voltage and Vaa. The reference voltage is the minimum value of the boost voltage Vbst. If the voltage on the capacitor is less than this reference value then the boost circuit may not be operating properly. To properly detect multiple different boost voltages, it may be desirable to implement different circuits, each coupled to a respective row control signal or to change the value of the reference voltage when different control signals are multiplexed on to the input terminal of the charge pump 820.

Figure 9:
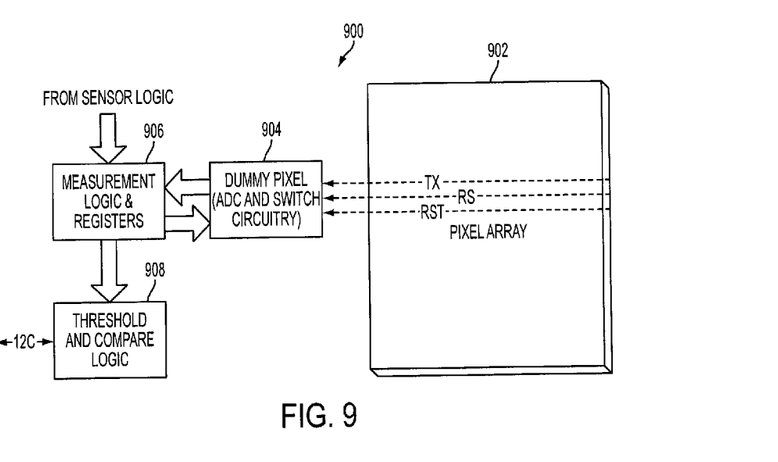
FIG. 9 is a block diagram of a row signal tester.

FIG. 9 is an example circuit that may be used to measure the levels of each of the signals TX, RS and RST. Although not shown, DCG or any other row control signal may be similarly tested. The circuit 900 shown in FIG. 9 uses a single dummy pixel 904 at the end of each row in the pixel array. An example dummy pixel 904 is described below with reference to FIG. 10. Essentially, the dummy pixel selects, samples and digitizes one of the control signals and applies the result to the measurement logic and registers 906. The measurement logic 906 determines which control signal to select and when it should be selected. This selection is passed by the circuitry 906 to the dummy pixel 904. The output signal of the measurement logic 906 is applied to threshold and compare logic which compares each of the digitized control signal values to target values. If any control signal differs by more than a threshold value from its target value, the identity and error value for the control signal may be transmitted to a global control processor (not shown) via a serial I2C bus.

Figure 10:
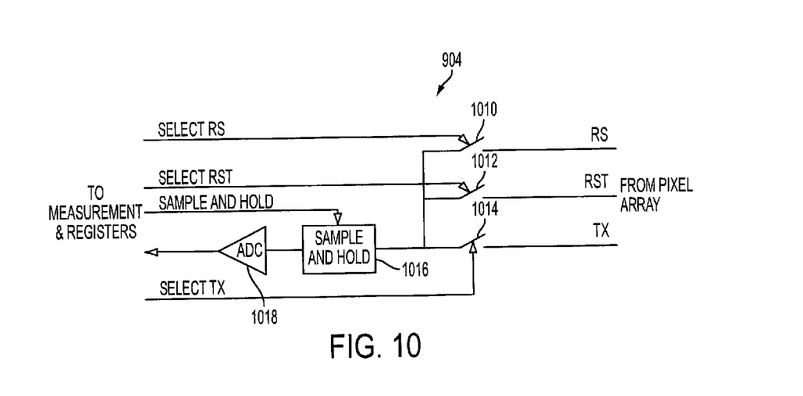
FIG. 10 is a schematic diagram, partly in block-diagram form of an example dummy pixel that may be used with the row signal tester shown in FIG. 10.

FIG. 10 is a block diagram of an example dummy pixel circuit suitable for use as the dummy pixel 904 shown in FIG. 9. The circuit 904 includes an analog multiplexer having switches 1010, 1012 and 1014. These switches, which may, for example, be transmission gates, are coupled at a first end to a respective one of the row control signals RS, RST and TX. The other ends of the switches are tied together and coupled to the input terminal of a sample and hold circuit 1016. The output terminal of the sample and hold circuit 1016 is coupled to the input terminal of an ADC 1018. Switch 1010 is responsive to a control signal Select RS which, when asserted couples the row select signal, RS, to the sample and hold circuit 1016. The other switches are similarly controlled by the control signals Select RST and Select TX.

The pixel array 902 may include multiple dummy pixels 904, for example, one per row. The array may be implemented with fewer dummy pixels, however. In one embodiment, the analog multiplexer may include additional switches so that row-control signals from two or more adjacent rows are selectively applied to the sample and hold circuit 1016. The output signals from, and input signals to the dummy pixels may be coupled to a bus which is also coupled to a single measurement logic and registers circuit 906. Similarly, the example imager may include a single threshold and compare logic 908.

Because the row control signals may be boosted, the monitoring circuitry shown in FIG. 9 desirably conforms to high-voltage design rules. In addition, the ADC 1018 may use a supply voltage that is greater than the highest boosted row control voltage in order to properly digitize the values of the row-control signals. The ADC 1018 may be a serial successive approximation ADC.

The subject invention has been described as an example row control-signal monitoring system for an electronic imager. The circuitry includes signal processing circuitry coupled a pixel array of the electronic imager which receives at least one row control signal from the pixel array and provides an output signal corresponding to the selected row control signal. Monitoring circuitry compares the output signal to a target value to test the at least one row-control signal.

The subject invention has been described in terms of examples. It is contemplated, however, that the invention may be practice with modifications that are within the scope of the following claims.

What is claimed:

1. Row-control signal monitoring apparatus for an electronic imager having a pixel array including a plurality of rows of pixels, the pixel array having first and second sides and row addressing circuitry coupled to the first side of the pixel array, the apparatus comprising:
   signal processing circuitry coupled to the second side of the pixel array and configured to receive at least one row control signal from the pixel array, to process the at least one row control signal and to provide an output signal at an output terminal; and
   monitoring circuitry having an input terminal coupled to the output terminal of the signal processing circuitry for comparing the output signal of the signal processing circuitry to a target value to test the at least one row-control signal, wherein the pixel array includes a plurality of row control signals for each row, and the signal processing circuitry further includes a plurality of multiplexers, one for each row of the pixel array, wherein the plurality of control signals for each row of the pixel array are coupled to respective input terminals of each of the multiplexers and an output terminal of each of the multiplexers is coupled to the signal processing circuitry.

2. Apparatus according to claim 1, wherein one row control signal for each row of the pixel array is coupled to the signal processing circuitry, and wherein:
   the signal processing circuitry includes:
   an array of encoders coupled in parallel, each encoder including a plurality of stages and being coupled to receive a respective one of the row control signals; and
   a plurality of latches each latch being coupled to a respective one of the parallel connected encoder stages.

3. Apparatus according to claim 1, wherein:
   the signal processing circuitry includes an analog-to-digital converter coupled to the output terminal of the multiplexer for digitizing the row control signal values provided by the multiplexer; and the monitoring circuitry includes threshold and comparison circuitry which compares the measured row control signal values to at least one threshold to determine if the row control signal is defective.

4. Apparatus according to claim 3 further including a sample and hold circuit coupled between the output terminal of the multiplexer and the input terminal of the analog-to-digital converter.

5. Apparatus according to claim 3 further including an interface to a serial bus for transmitting an indication of a defective row control signal to a control processor.

6. Apparatus according to claim 1, wherein the row control signals include boosted row control signals in which a boost voltage is added to the supply voltage to generate the row-control signal:
   the signal processing circuitry includes a charge pump; and
   a comparator;
   wherein:
   the charge pump coupled to receive the row control signal and a reference voltage value at an input port and coupled to the comparator at an output port,
   the charge pump provides a voltage to the comparator substantially equal to the value of the row control signal minus the value of the reference voltage; and the comparator is configured to compare the output signal provided by the charge pump to a further reference voltage to determine if the boost voltage is proper.

7. Apparatus according to claim 6, wherein each of the plurality of row control signals for a row of pixels in the pixel array uses a respectively different boost voltage and the second reference voltage is less than a smallest one of the boost voltages.

8. Apparatus according to claim 6, wherein each of the plurality of row control signals for a row of pixels uses a respectively different boost voltage and the second reference voltage is different for each row-control signal for the plurality of row control signals for a row of pixels in the pixel array.

9. Row-control signal monitoring apparatus for an electronic imager having a pixel array including a plurality of rows of pixels, the pixel array having first and second sides and row addressing circuitry coupled to the first side of the pixel array, the apparatus comprising:
    signal processing circuitry coupled to the second side of the pixel array and configured to receive at least one row control signal from the pixel array, to process the at least one row control signal and to provide an output signal at an output terminal; and
    monitoring circuitry having an input terminal coupled to the output terminal of the signal processing circuitry for comparing the output signal of the signal processing circuitry to a target value to test the at least one row-control signal, wherein one row control signal for each row of the pixel array is coupled to the signal processing circuitry and the signal processing circuitry includes:
        a voltage divider network having a plurality of serially connected elements;
        a plurality of transistors each having a source electrode coupled to a source of operational potential, a gate electrode coupled to a respective one of the plurality of row control signals of the pixel array and a drain electrode coupled to a respective one of the elements of the voltage divider network; and
        an analog-to-digital converter coupled to the voltage divider network to digitize a voltage signal provided by the voltage divider network to produce a digital value representing a row number of the at least one row-select signal.

10. Apparatus according to claim 9, further including verification logic configured to translate the digital value provided by the analog-to-digital converter into a row number and to compare the translated row number to a row address value provided to the row addressing circuitry of the electronic imager.

11. Apparatus according to claim 9, wherein the serially connected elements of the voltage divider are resistors.

12. Apparatus according to claim 9, wherein the serially connected elements of the voltage divider are capacitors.

13. Row-control signal monitoring apparatus for an electronic imager having a pixel array including a plurality of rows of pixels, the pixel array having first and second sides and row addressing circuitry coupled to the first side of the pixel array, the apparatus comprising:
    signal processing circuitry coupled to the second side of the pixel array and configured to receive at least one row control signal from the pixel array, to process the at least one row control signal and to provide an output signal at an output terminal; and
    monitoring circuitry having an input terminal coupled to the output terminal of the signal processing circuitry for comparing the output signal of the signal processing circuitry to a target value to test the at least one row-control signal, wherein one row control signal for each row of the pixel array is coupled to the signal processing circuitry, and
    wherein the signal processing circuitry includes:
        an array of encoders coupled in parallel, each encoder including a plurality of stages and being coupled to receive a respective one of the row control signals; and
        a plurality of latches each latch being coupled to a respective one of the parallel connected encoder stages.

14. Apparatus according to claim 13 further including a plurality of sense amplifiers, each sense amplifier having an input terminal coupled to a respective one of the parallel connected encoder stages and having an output terminal coupled to a respective one of the plurality of latches.

15. Apparatus according to claim 13, wherein the pixel array is responsive to a control signal to selectively bin pixel values from successive rows of the pixel array and wherein;
    the stages of the encoders are arranged from a most significant bit (MSB) position to a least significant bit (LSB) position;
    for alternate ones of the encoders, the encoder stage in the LSB position is coupled to first and second respectively different latches of the plurality of latches; and
    the signal processing circuitry is responsive to a control signal to combine signals produced by the first and second latches when the pixel array is not in the binning mode and to separate the signals provided by the first and second latches when the pixel array is in the binning mode.

16. A method for monitoring row-control signals in an electronic imager having a pixel array including a plurality of rows of pixels, the pixel array having first and second sides and row addressing circuitry coupled to the first side of the pixel array, the method comprising:
    processing at least one of the row-control signals provided at the second side of the pixel array to provide an output signal; and
    monitoring the output signal by comparing the output signal to a target value to test the at least one row-control signal, wherein the processing of the at least one row control signal includes
        Processing a selected row control signal for each row of the pixel array by generating a voltage signal representing a row number of the selected row control signal in the pixel array;
        digitizing the voltage signal to produce a digital value representing the row number;
        translating the digital value to a row number and
        comparing the translated row number to a row number of the at least one selected row.

17. A method for monitoring row-control signals in an electronic imager having a pixel array including a plurality of rows of pixels, the pixel array having first and second sides and row addressing circuitry coupled to the first side of the pixel array, the method comprising:
    processing at least one of the row-control signals provided at the second side of the pixel array to provide an output signal; and
    monitoring the output signal by comparing the output signal to a target value to test the at least one row-control signal, wherein the processing of the at least one row control signal includes applying the control signal for at least one selected row to an encoder which encodes a digital value representing a row number of the selected row control signal; and comparing the encoded row number to a row number of the at least one selected row.

18. A method for monitoring row-control signals in an electronic imager having a pixel array including a plurality of rows of pixels, the pixel array having first and second sides and row addressing circuitry coupled to the first side of the pixel array, the method comprising:

processing at least one of the row-control signals provided at the second side of the pixel array to provide an output signal; and monitoring the output signal by comparing the output signal to a target value to test the at least one row-control signal, wherein each of the rows in the pixel array includes a plurality of respectively different row control signals and the processing of the at least one row control signal includes:

selecting one row of the plurality of rows in the pixel array;

selecting one of the plurality of respectively different row control signals for the selected row;

digitizing the selected row control signal to provide a digital value; and comparing the digitized row control signal values to at least one threshold to determine if the row control signal is defective.

* * * * *